(12) United States Patent  (10) Patent No.: US 7,962,866 B2
White et al.  (45) Date of Patent: *Jun. 14, 2011

(54) METHOD, SYSTEM, AND COMPUTER PROGRAM PRODUCT FOR DETERMINING THREE-DIMENSIONAL FEATURE CHARACTERISTICS IN ELECTRONIC DESIGNS

(75) Inventors: David White, San Jose, CA (US); Louis K. Scheffer, Campbell, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 385 days.

This patent is subject to a terminal disclaimer.

(21) Appl. No.: 11/866,383

(22) Filed: Oct. 2, 2007

(65) Prior Publication Data

US 2008/0163142 A1  Jul. 3, 2008

Related U.S. Application Data

(60) Provisional application No. 60/877,941, filed on Dec. 29, 2006.

(51) Int. Cl.
 *G06F 17/50* (2006.01)
 *G06F 17/10* (2006.01)
 *G06F 19/00* (2006.01)
(52) U.S. Cl. .............. 716/54; 716/55; 716/112; 700/98; 700/120; 700/121; 700/110; 703/2; 703/14
(58) Field of Classification Search ................ 716/5, 21; 700/98, 110, 120, 121; 703/2, 14
See application file for complete search history.

(56) References Cited

U.S. PATENT DOCUMENTS

| 6,892,364 | B2 | 5/2005 | Baader et al. |
| 6,952,688 | B1 | 10/2005 | Goldman et al. |
| 6,973,635 | B2 | 12/2005 | Happoya |
| 7,062,741 | B1 | 6/2006 | Leng et al. |
| 7,082,588 | B2 | 7/2006 | Scheffer et al. |
| 7,124,386 | B2 | 10/2006 | Smith et al. |
| 7,152,215 | B2 | 12/2006 | Smith et al. |
| 7,174,520 | B2 | 2/2007 | White et al. |
| 7,174,521 | B2 | 2/2007 | Stine et al. |
| 7,243,316 | B2 | 7/2007 | White et al. |
| 7,254,798 | B2 | 8/2007 | Scheffer et al. |
| 7,260,810 | B2 | 8/2007 | Filippi et al. |

(Continued)

OTHER PUBLICATIONS

Notice of Allowance dated Feb. 23, 2010 for U.S. Appl. No. 11/866,370.

(Continued)

*Primary Examiner* — Phallaka Kik
(74) *Attorney, Agent, or Firm* — Vista IP Law Group, LLP

(57) ABSTRACT

Disclosed are an improved method, system, and computer program product for a method or system with concurrent models to more accurately determine and represent the three-dimensional design features of electronic designs. Some embodiments disclose a method or a system for determining the design feature characteristics based upon their respective three-dimensional profiles. Some other embodiments further determine whether the design objectives or constraints are met or may be relaxed based upon the design feature characteristics in order to complete the design. Other embodiments store the profile or geometric characteristics, or information derived therefrom, in a database associated with the design to reduce the need for potentially expensive computations. The method or system may modify the designs or the processes to reflect whether the design objectives or constraints are met or relaxed.

30 Claims, 6 Drawing Sheets

U.S. PATENT DOCUMENTS

| | | | |
|---|---|---|---|
| 7,289,867 B1 | 10/2007 | Markle et al. | |
| 7,302,672 B2 | 11/2007 | Pack et al. | |
| 7,325,206 B2 | 1/2008 | White et al. | |
| 7,353,475 B2 | 4/2008 | White et al. | |
| 7,356,783 B2 | 4/2008 | Smith et al. | |
| 7,360,179 B2 | 4/2008 | Smith et al. | |
| 7,363,099 B2 | 4/2008 | Smith et al. | |
| 7,363,598 B2 | 4/2008 | Smith et al. | |
| 7,367,008 B2 | 4/2008 | White et al. | |
| 7,373,627 B2 | 5/2008 | Shigyo et al. | |
| 7,380,220 B2 | 5/2008 | Smith et al. | |
| 7,383,521 B2 | 6/2008 | Smith et al. | |
| 7,392,496 B1 | 6/2008 | Schultz et al. | |
| 7,393,755 B2 | 7/2008 | Smith et al. | |
| 7,395,516 B2 | 7/2008 | Fujimura et al. | |
| 7,401,310 B1 | 7/2008 | Thaden et al. | |
| 7,448,014 B2 | 11/2008 | Lavin et al. | |
| 7,451,411 B2 | 11/2008 | Hau-Riege et al. | |
| 7,526,748 B2 | 4/2009 | Kotani et al. | |
| 7,570,796 B2 | 8/2009 | Zafar et al. | |
| 7,627,837 B2 * | 12/2009 | Zhang | 716/2 |
| 7,676,077 B2 | 3/2010 | Kulkarni et al. | |
| 7,721,237 B2 * | 5/2010 | Scheffer et al. | 716/6 |
| 2003/0033041 A1 * | 2/2003 | Richey | 700/98 |
| 2003/0237064 A1 | 12/2003 | White et al. | |
| 2004/0210423 A1 | 10/2004 | Ashida et al. | |
| 2004/0243962 A1 | 12/2004 | Subasic et al. | |
| 2005/0037522 A1 | 2/2005 | Smith et al. | |
| 2005/0051809 A1 | 3/2005 | Smith et al. | |
| 2005/0076316 A1 | 4/2005 | Pierrata et al. | |
| 2005/0132306 A1 | 6/2005 | Smith et al. | |
| 2005/0188338 A1 | 8/2005 | Kroyan et al. | |
| 2005/0196964 A1 | 9/2005 | Smith et al. | |
| 2005/0235246 A1 | 10/2005 | Smith et al. | |
| 2005/0251771 A1 | 11/2005 | Robles | |
| 2005/0263722 A1 | 12/2005 | Marrian et al. | |
| 2005/0268256 A1 | 12/2005 | Tsai et al. | |
| 2006/0026544 A1 | 2/2006 | Engel et al. | |
| 2006/0085772 A1 * | 4/2006 | Zhang | 716/4 |
| 2006/0265679 A1 | 11/2006 | Scheffer et al. | |
| 2007/0089078 A1 | 4/2007 | Engel et al. | |
| 2007/0101301 A1 | 5/2007 | Miyata | |
| 2007/0101305 A1 | 5/2007 | Smith et al. | |
| 2007/0114396 A1 | 5/2007 | Tohyama | |
| 2007/0119616 A1 | 5/2007 | Horikawa et al. | |
| 2007/0256039 A1 | 11/2007 | White | |
| 2007/0266364 A1 | 11/2007 | Pack et al. | |
| 2007/0283298 A1 | 12/2007 | Bernstein et al. | |
| 2008/0027698 A1 | 1/2008 | White | |
| 2008/0034335 A1 | 2/2008 | Cheng et al. | |
| 2008/0148216 A1 | 6/2008 | Chan et al. | |
| 2008/0160646 A1 | 7/2008 | White et al. | |
| 2008/0162103 A1 | 7/2008 | White et al. | |
| 2008/0163139 A1 | 7/2008 | Scheffer et al. | |
| 2008/0163141 A1 | 7/2008 | Scheffer et al. | |
| 2008/0163148 A1 | 7/2008 | Scheffer et al. | |
| 2008/0163150 A1 | 7/2008 | White et al. | |
| 2008/8016314 | 7/2008 | White et al. | |
| 2008/0216027 A1 | 9/2008 | White et al. | |
| 2008/0307371 A1 | 12/2008 | Fujimura et al. | |
| 2009/0031261 A1 | 1/2009 | Smith et al. | |
| 2009/0031271 A1 | 1/2009 | White et al. | |
| 2009/0125868 A1 | 5/2009 | Mukherjee et al. | |
| 2010/0153904 A1 * | 6/2010 | Zhang | 716/21 |

OTHER PUBLICATIONS

Non-Final office Action dated Jun. 7, 2010 for U.S. Appl. No. 11/866,378.

Non-Final Office Action dated Jun. 6, 2010 for U.S. Appl. No. 11/866,383.

Final Office Action dated May 24, 2010 for U.S. Appl. No. 11/866,386.

Non-Final Office Action dated Jan. 12, 2010 for U.S. Appl. No. 11/866,385.

* cited by examiner

METHOD, SYSTEM, AND COMPUTER PROGRAM PRODUCT FOR DETERMINING THREE-DIMENSIONAL FEATURE CHARACTERISTICS IN ELECTRONIC DESIGNS

CROSS-REFERENCE TO RELATED APPLICATION(S)

This application claims the benefit of U.S. Provisional Application No. 60/877,941, filed on Dec. 29, 2006, which is hereby incorporated by reference in its entirety.

BACKGROUND OF THE INVENTION

As the device size shrinks, especially into the deep-submicron regime, and clock frequency increases, the electrical properties of circuit design features become more prominent, and chips are more susceptive to breakdown during fabrication due to, for example, antenna effect or to wear out over time due to, for example, electro-migration.

One approach assumes the thickness of certain features, such as the features or interconnects, to be a certain numeric value and manipulates the widths and/or lengths of such features to achieve the design objectives. Another approach obtains the thickness of the features from process model and/or fabrication information and use such information together with the width and/or length information to more accurately estimate the bulk properties of such features. Both approaches exist for practical purposes as the IC designs today or in the near future are not all that sensitive to variations due to the deviations of these features from their true profiles.

Moreover, the continual effort to scale down to the deep submicron region and/or to increase clock frequency requires multilevel interconnection architecture to minimize the timing delay due to parasitic resistance and capacitance. As the devices shrinks smaller, the delay caused by the increased R-C time constant becomes more significant over the delay caused by the actual profiles of the features. In order to reduce the R-C time constant, interconnect materials with lower resistivity and interlayer films with lower capacitance are required. However, the use of low-k dielectric material aggravates the electro-migration problem due to the poor thermal conductivity of these low-k dielectric materials.

One way of resolving the aforementioned problems introduced by the continual reduction in feature sizes is to impose certain density rules for metal filling. Such rules typically comprise certain maximum and minimum densities within certain windows on the chip. Some other rules impose different density limits among different window areas. However, such rules typically assume that the thickness of the wire is constant according to certain formulae and therefore manipulate only the width or spacing of the wires to achieve the design goals. As a result, such rules typically assume the cross-sectional profile of a wire to be rectangular. More advanced rules may compute results in terms of an equivalent rectangular cross section, allowing some compensation for non-rectangular cross sections. However, even these more advanced approaches only consider the wire properties as a function of a few characteristics, such as the width of a wire and the distance to the nearest neighbors. Although these assumptions arose out of practical considerations and have worked while the thickness variation is relatively insignificant as compared to the geometry sizes, such an assumption appears to be outdated, especially in light of the current development in incorporating the topological variations of each film into the electronic designs and the continuously shrinkage in sizes of device features. Moreover, wire width cannot be arbitrarily changed due to the polycrystalline structure of the interconnect materials. As a result, additional methods have been developed to slot certain wires such that the metal density within certain region falls within the prescribed maximum and minimum limits.

Nonetheless, the above rule-based methods pose new problems. For instance, a good interconnect may be wrongfully determined to be improper for failing to meet certain design rules or for producing unacceptable R-C delay even though the interconnect actually satisfies the design goals by having certain thickness that is different from the assumed value. A contrary example is that a bad interconnect may also be wrongfully determined to be proper for meeting the metal density rules and/or the delay requirement.

Additionally, the continual effort to scale down to the deep submicron region renders the design more susceptible to even slight variations of or deviations of the design features from their true profile particularly in deep submicron designs. Furthermore, using presumed thicknesses of certain features or thickness information from the process/fabrication models without truthfully approximating the true profiles of certain features would sometimes falsely identify a perfectly good design to be bad and a bad design to be good. In some other times, using presumed thicknesses or cross sections of certain features or thickness information from the process/fabrication models without truthfully approximating the true profiles of certain features would falsely report that certain designs fail to meet certain objectives and cause unnecessary redesign or waste of valuable real estate in the chip area.

SUMMARY OF THE INVENTION

As a result, there exists a need for a more accurate and effective method for predicting the profile of the features so as to more accurately determine the properties of the features and thus more effectively determine whether the design in fact meet the manufacturability, performance, reliability, and/or other design objectives. The present invention is directed to an improved method, system, and computer program product for an electronic design automation tool to more accurately determine the three-dimensional profiles of features in an electronic design. Some embodiments utilizes the above method, system, and/or computer program to produce more accurate wire/feature profiles for determine whether the design meets certain design objectives.

DESCRIPTION OF FIGURES

The drawings illustrate the design and utility of preferred embodiments of the present invention. It should be noted that the figures are not drawn to scale and that elements of similar structures or functions are represented by like reference numerals throughout the figures. In order to better appreciate how the above-recited and other advantages and objects of the present inventions are obtained, a more particular description of the present inventions briefly described above will be rendered by reference to specific embodiments thereof, which are illustrated in the accompanying drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION

The present invention is directed to an improved method, system, and computer program product for an electronic design automation tool to more accurately determine the three-dimensional profiles of features in an electronic design. Some embodiments utilizes the above method, system, and/or computer program to produce more accurate wire/feature profiles for determine whether the design meets certain design objectives. As noted above, conventional methods and systems assume a thickness value for each wire and neglect the impact of variation of wire properties as a result of deviation from the assumed rectangular profile and thus either use unnecessary computation resources to produce the results or even produce unsatisfactory results. More details concerning the concurrent models are disclosed in U.S. application Ser. No. 11/866,378, which is filed concurrently with this Application, and also in U.S. application Ser. No. 11/866,376, now U.S. Pat. No. 7,721,237, which is also filed concurrently with this instant Application. The contents of both applications are hereby incorporated by reference in their entirety.

Figure 1:
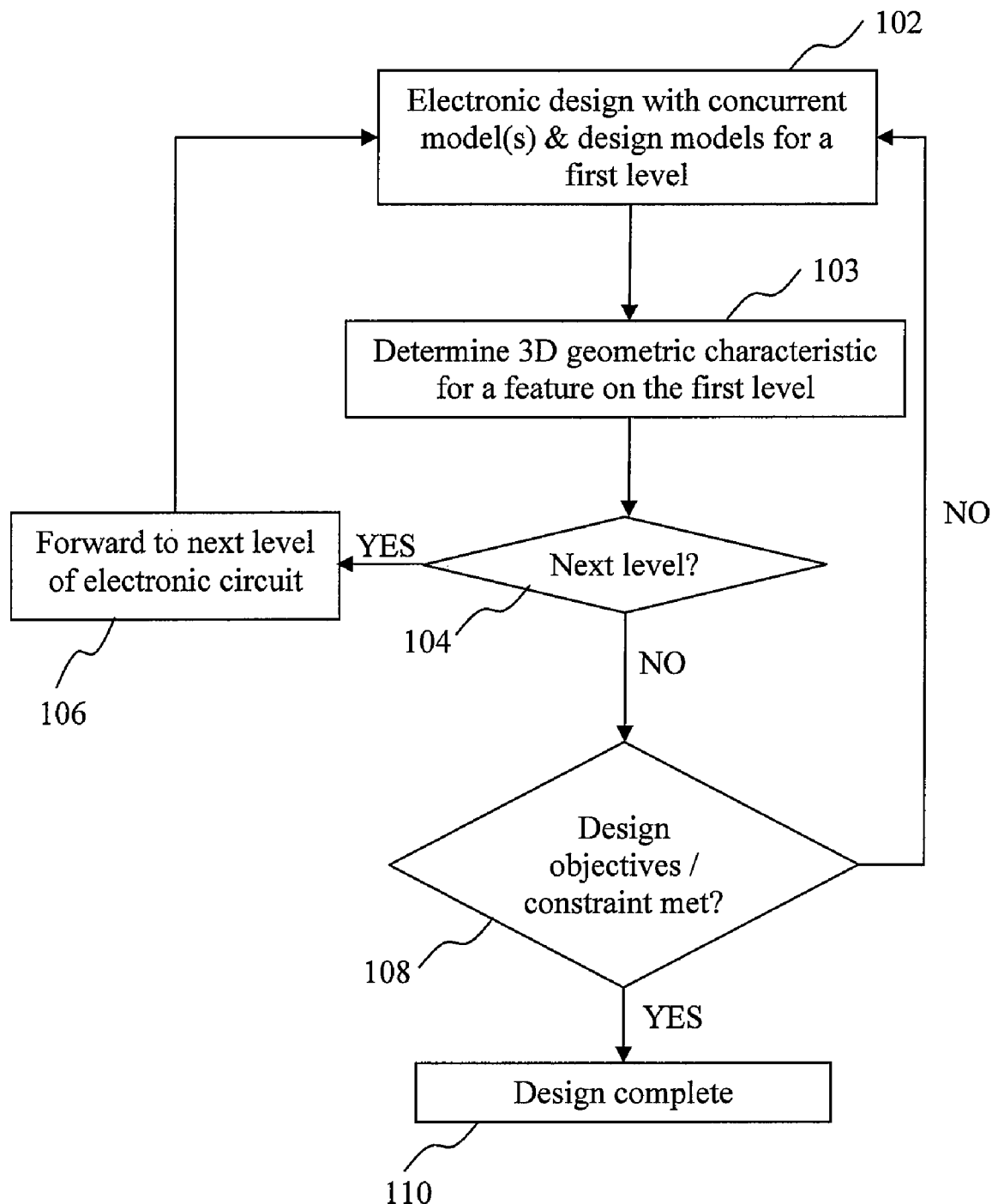
FIG. 1 illustrates a general flow of a design tool with concurrent models to analyze the three dimensional design features.

FIG. 1 depicts a high level flow chart of a design method with concurrent process model analyses. At 102, the method or the system of various embodiments of the invention identifies an electronic circuit design with one or more concurrent models for one or more processes or techniques to analyze the electronic design to generate an electronic circuit design with three-dimensional characteristics of the electronic circuit features for the first level of the electronic circuit. The one or more processes or techniques upon which the one or more concurrent models are built may comprise, for example but shall not be limited to, a fabrication process or technique, a metrology process or technique, or an image processing process or technique. It shall be noted that a level of the electronic circuit may comprise an interconnect level, a metal layer, or a mask level of the electronic circuit.

In some embodiments of the present invention, a concurrent model may be constructed based purely upon direct simulation of the underlying principles of physics and/or mathematical methods for the process or technique which the concurrent model precisely describes.

In other embodiments, a concurrent model may first be built upon some physics principles and/or mathematical methods to approximate the process or technique the concurrent is to describe. Such an approximate concurrent model may be further fine tuned with data or information obtained from sources such as one or more patterned test wafers or from other sources of limited fidelity such as a simple analytic model, empirical formulae or models, formulae or models with interpolation or extrapolation of information or data, or other approximations. That is, a concurrent model may be constructed by some, for example, simplified physics principles and/or mathematical methods and may then be further fine tuned by data or information extracted from one or more patterned test wafers or from other sources of limited fidelity such as a simple analytic model, empirical formulae or models, formulae or models with interpolation or extrapolation of information or data, or other approximations.

Some embodiments may combine the output of a concurrent model into a discrete value for a given feature or multiple values for a given feature in the form of a distribution or a statistical representation of the data such as mean, variance and range.

In some other embodiments, a concurrent model may be constructed purely upon data or information obtained or extracted from one or more patterned test wafers. For part or all of a given layer of an electronic circuit design or even the entire electronic circuit design, there may exist concurrent models built by some or all the aforementioned methods. There may exist concurrent models constructed by more than one of the aforementioned method even for the same process or technique which the concurrent models are constructed to describe. For example, where greater accuracy is desired or where the performance is critical in a sub-circuit, the concurrent model may be built upon physics principles and/or mathematical methods with or without the aid of extracted data or information from patterned test wafers. As another example, where the performance is not critical in certain part of the electronic circuit or where reducing cost is of greater concern for certain part of a layer of the electronic circuit design or certain part of the electronic circuit itself, a concurrent model may be built purely upon information or data extracted from patterned test wafers.

Moreover, the fabrication process or technique may comprise, for example but shall not be limited to, a deposition process, a removal process, a patterning process, or a property modification process or technique.

More particularly, the deposition processes or techniques upon which the one or more concurrent models are built may comprise, for example but shall not be limited to, physical vapor deposition (PVD), chemical vapor deposition (CVD), atomic layer deposition (ALD), electrochemical deposition or electro-plating (ECD), electroless plating or deposition, auto-catalytic plating or deposition, and molecular beam epitaxy (MBE). The removal processes may comprise, for example but shall not be limited to, isotropic or anisotropic wet or dry etching, chemical mechanical polishing (CMP), or reflow processes.

The removal process or technique may comprise, for example but shall not be limited to, isotropic or anisotropic wet or dry etching, chemical mechanical polishing (CMP), or reflow processes.

The patterning processes may comprise, for example but shall not be limited to, lithography processes or techniques such as lithography processes or techniques comprise microlithography, nanolithography, photolithography, electron beam lithography, maskless lithography, nanoimprint lithography, interference lithography, x-ray lithography, extreme ultraviolet lithography, or scanning probe lithography, or the plasma ashing processes.

The property modification processes or techniques may comprise, for example but shall not be limited to, ion implantation, annealing, oxidation, UVP (ultraviolet light processing).

The metrology process or technique may comprise, for example but shall not be limited to, transmission electron microscopy (TEM), scanning electron microscopy (SEM), transmission electron aberration-corrected microscopy, energy filtered TEM, optical measurement techniques.

The imaging processing techniques or processes may comprise, for example but shall not be limited to, various resolution enhancement techniques such as ruled-based or model-based Optical Proximity Correction (OPC), Subresolution Assist Features (SRAF), Phase Shifting-Mask (PSM), and Off-Axis Illumination (OAI).

As mentioned above, in some embodiments, the concurrent models for the aforementioned processes or techniques may be constructed by purely referring to the underlying principles of physics with mathematical algorithms. For example, the concurrent models for deposition or removal processes may be constructed by modeling the plasma physics, rarefied gas flow theories, fluid dynamics, diffusion theory, electromagnetism, mechanics, and/or the interactions thereof. The image processing techniques may be constructed by modeling optical physics, electromagnetic wave theories, and/or quantum mechanics. The concurrent models for the metrology processes or techniques may directly model the measurement result by modeling, for example, the thermionical behavior, the field emission effect, or the quantum tunneling effect of the SEM process to simulate the measurement results.

In some other embodiments, the concurrent models for the aforementioned processes or techniques may be constructed by employing some simplified physics models in terms of mathematical methods and then fine tuned or calibrated by the information or data extracted from one or more patterned test wafers with similar or identical features as those to be manufactured in the actual electronic circuit design. For example, the concurrent models may be constructed by adopting certain empirical formulae for certain processes or techniques which may approximate the physical phenomena of the aforementioned processes or techniques within certain tolerable accuracy. Such concurrent models may then be calibrated or fine tuned with the information or data extracted from one or more patterned test wafers with similar or identical features as those to be manufactured in the actual electronic circuit design.

In some other embodiments, the concurrent models for the aforementioned processes or techniques may be constructed by creating certain rules based upon the information or data extracted from one or more patterned test wafers with similar or identical features as those to be manufactured in the actual electronic circuit design. For example, the concurrent models may simply contain certain rules which are built upon the information or data extracted from one or more patterned test wafers. Such rules may comprise, for example but shall not be limited to, metal density rules, spacing rules, rules on geometric characteristics of electronic design features, etc. These rules may be constructed by extracting, interpolating, or extrapolating information or data from one or more patterned test wafers containing similar or identical features as those to be manufactured on the actual electronic circuit.

Some other embodiments may be applied where only a portion of the final complete layout, for example one or more blocks or cells, is available. A context simulation method may be used to introduce likely geometric environments into the incomplete regions, for example structures with similar densities or line widths, or an environment with a geometric distribution based on prior designs. For processes with large pattern interaction ranges such as CMP, simulation of layout portions not available may be useful. More details about context simulation is described in U.S. patent application Ser. No. 11/768,851, entitled "METHOD AND SYSTEM FOR IMPLEMENTING CONTEXT SIMULATION" filed on Jun. 26, 2007, which is incorporated herein by reference in its entirety.

Referring back to FIG. 1. At 103, the method or the system of some embodiments of the invention determines a three-dimensional profile or three-dimensional geometric characteristic for a feature on the current level of the electronic circuit. Moreover, in some embodiments of the invention, the method or the system may optionally determine whether a design objective, design constraint, or a requirement is satisfied in light of the three-dimensional profile or geometric characteristic of the feature a the current level. Where it is determined that some objective, constraint, or requirement is not satisfied and such objective, constraint, or requirement does not belong to certain don't care space or may not be relaxed, the method or the system of some embodiments of the invention may revert back to 102 or may further invoke a modification process to modify the design, part of the design, or the process upon which the concurrent model is determined. More details about the modification process are described in subsequent sections. Where it is determined that some objective, constraint, or requirement is not satisfied, yet such objective, constraint, or requirement belongs to certain don't care space or may be relaxed, the method or the system of some embodiments of the invention may nonetheless present an option to the user or the designer to determine whether to revert back to 102, whether to invoke the modification process, or whether to proceed to the next act. Where it is determined that some objective, constraint, or requirement is not satisfied, yet such objective, constraint, or requirement belongs to certain don't care space or may be relaxed, the method or the system of some embodiments of the invention may the proceed to 104. Where it is determined that all the objectives, constraints, or requirements are satisfied, the method or the system of some embodiments of the invention may then proceed to 104.

At 104, after the circuit designer completes the design and determination of the three-dimensional profile or geometric characteristic, the method or the system of some embodiments of the invention determines whether to continue to the next level in the electronic circuit. If the method or the system of some embodiments of the present invention or the designer determines there are additional levels to process, the method or the system of some embodiments of the present invention then forwards the design data and information to the next interconnect level for further analyses and design at 106.

If the method or the system of some embodiments of the present invention or the designer determines there is no further interconnect level to process, the method or the system of some embodiments of the present invention determines whether certain design objectives or constraints are met at 108 while taking the process models and three-dimensional design feature models into consideration. If the design objectives are fulfilled, the method proceeds to 110 where the design is complete. The designer may generate, for example, the Graphical Data System II (GDS II) file for tapeout or may perform further verification before final tapeout. However, if certain design objectives of the design process goes back to 102 and repeats 102-108 until the one or more design closure requirements are properly concluded.

Figure 2:
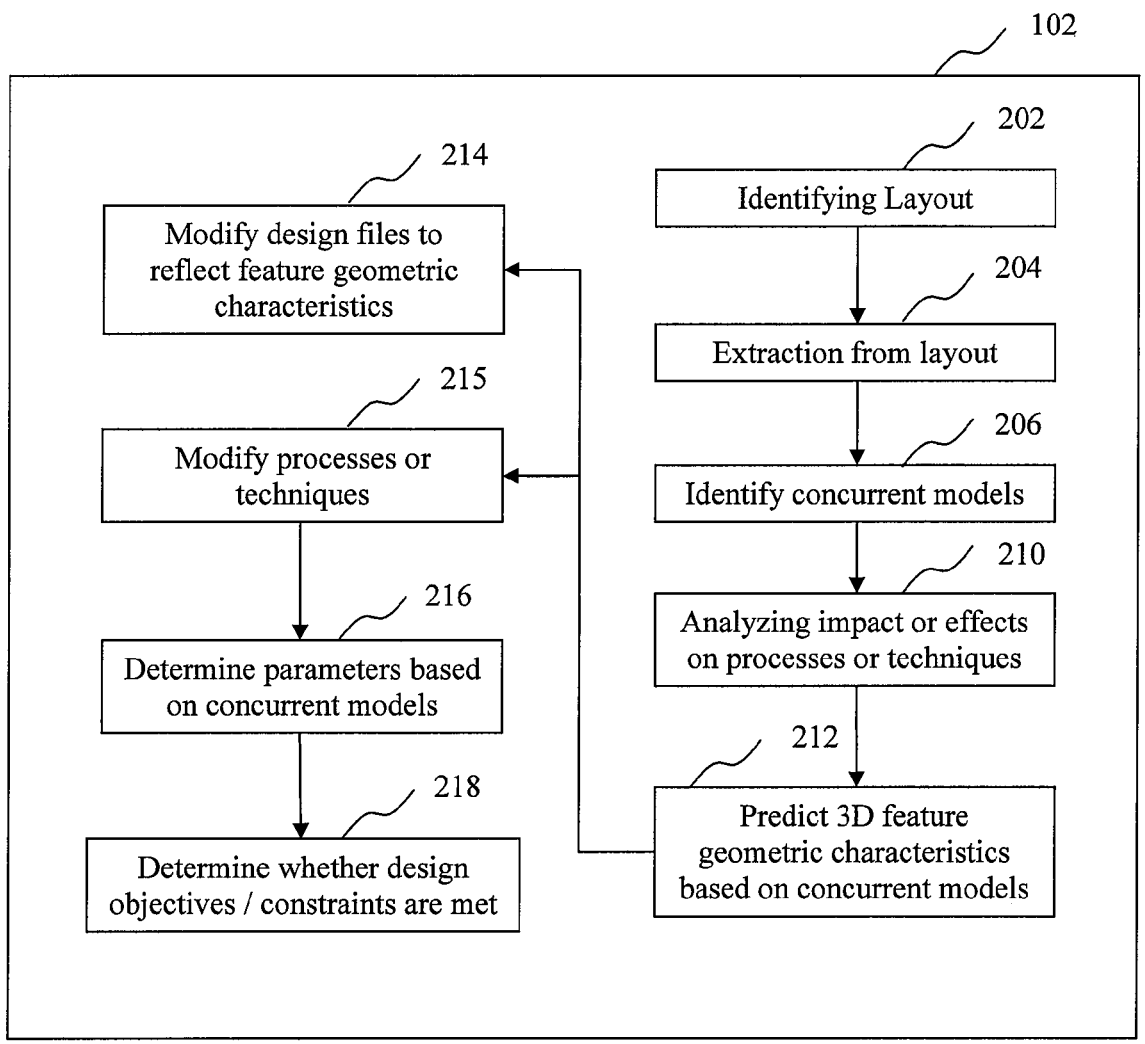
FIG. 2 illustrates an example of a method for a design tool with concurrent process models to analyze the three dimensional design features and design objectives or constraints.

FIG. 2 further illustrates one embodiment of the method or the system of some embodiments of the present invention with concurrent model analysis.

At 202, the method or the system of some embodiments of the present invention generates an electronic circuit design layout based upon, for example but shall not be limited to, the designer's intent and specification. At 204, the method or the system of some embodiments of the present invention performs extraction of the design layout. The method or the system of some embodiments of the present invention then identifies one or more concurrent models based upon the processes or techniques involved in the manufacturing of the electronic circuit at 206. At 210, the method or the system of some embodiments of the present invention then analyzes the effects or impacts of the processes or techniques upon which the one or more concurrent models are based on the electronic circuit design and the one or more concurrent models. At 212, the method or the system of some embodiments of the present invention predicts the design feature geometric characteristics such as feature dimensions or the variations thereof based on the one or more concurrent models.

Based upon the predicted geometric characteristics or variations or deviations therefrom and/or characteristics as designed, the method or the system of some embodiments of the present invention then determine whether to modify the design file such as a GDS II or OASIS file to reflect the predicted geometric characteristics or the variations thereof in the design feature geometric characteristics at 214. In the alternative, another embodiment may determine to modify the processes or techniques involved in the manufacturing of the electronic circuit based upon the predicted feature geometric characteristics such as dimensions and/or the process model information at 215. Such design feature geometric characteristics may include but shall not limited to geometrical profiles and shapes of the electronic circuit design features.

At 216, the method or the system of some embodiments of the present invention further determines one or more electrical parameters based upon the one or more concurrent models. Such electrical parameters may include, but not limited to, electrical resistance, electrical resistivity, bulk resistivity, capacitance, R-C time constant, current densities, power consumption, or IR drop. At 218, some embodiments of the present invention then determine the impact of the processes or techniques upon which the concurrent models are built upon the design objectives or constraints based upon the parameters previously determined at 216. A constraint is a design target that must be met in order for the design to function as designed. For example, an IC may be required to operate at or above a clock frequency or within a band of frequencies. Such a clock frequency requirement may be considered a constraint. On the other hand, an objective is a design goal which, even if not met, would not cause the IC product to fail or to improperly function. Rather, a design objective is one that more or higher is better. For example, a yield requirement may be considered a design objective as failure to meet the yield requirement would not cause the IC to fail or to function improperly, and the higher the yield the better the profitability will be.

Figure 3:
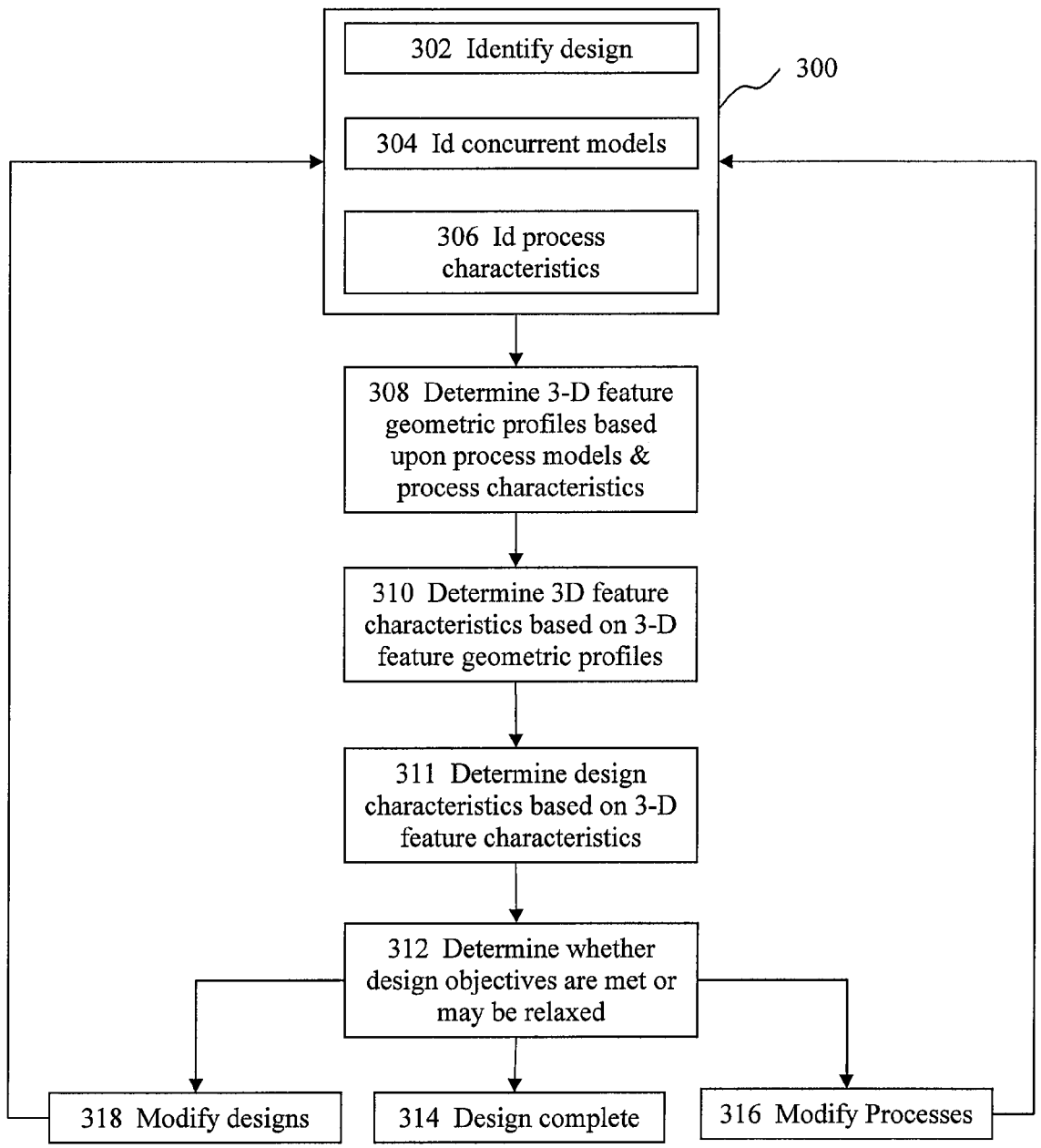
FIG. 3 illustrates an example of a method for a design tool with concurrent process models, process characteristics to analyze the three dimensional design features and design objectives or constraints.

FIG. 3 illustrates a methodology for a method or a system 300 of some embodiments of the present invention with concurrent three-dimensional model analysis. At 302, the method or the system identifies the electronic circuit designs. The method or the system may also incorporate the one or more concurrent models at 304. Additionally, the method or the system may further analyzes the information obtained from one or more concurrent models and determines the impact of the processes or techniques of the processes or techniques upon which the one or more concurrent models are built on the design features. At 306, the method or the system may also incorporate the information of characteristics related to each process or technique. Such information of characteristics related to each process or technique comprises, for example but shall not be limited to, plasma densities, temperature distribution across the substrate and/or from one wafer to another wafer, bias potential distribution across the wafer and/or from wafer to wafer, vacuum level and its variations, species of process chemistry and respective flow rate into the processing cell, or whether and how RF power is applied in processes.

The process characteristics related to the manufacturing process may also comprise the characteristics unique to each process chamber or cell. For example, the process characteristics may also comprise the characteristics of a scanning magnetron of a specific type of processing chamber, the manner of how process gases are introduced and distributed into the processing chamber, the distribution and manner of application of DC and RF power to the processing chamber, etc. Moreover, the process characteristics may further comprise one or more interactions between any two of the aforementioned process characteristics or one or more interactions between any of the aforementioned process characteristics and the existing features on the electronic circuit. For example, the process characteristics may comprise the rate or temporal and/or spatial distribution of re-sputtering or re-deposition to describe the interaction between an existing layer of features in the electronic circuit and another process characteristic such as the plasma density or distribution, the bias potential, power distribution to the source, or the magnetron which may individually or jointly cause the re-sputtering or re-deposition.

At 308, the method or the system of some embodiments of the present invention determines the three dimensional profiles or geometric characteristics of the design features based upon the one or more concurrent models and process characteristics.

For example, the method or the system of some embodiments of the present invention may incorporate characteristics specific to the fabrication process or to the processing tool and determine the the three dimensional profiles or geometric characteristics of design features to be fabricated by simulation of the underlying physics. In some other embodiments of the present invention, the method or the system may employ simplified physics models and then fine tune the simplified model with information or data obtained from one or more patterned test wafers which contain similar or identical features as those to be manufactured in the electronic circuit. In some other embodiments, the method or the system may determine or identify a concurrent model as one or more rules by analyzing the information or data obtained from the one or more patterned test wafers containing similar or identical features as those to be manufactured in the electronic circuit. For example, the method or the system of some embodiments of the invention may determine an effective cross-section area of a conductor by analyzing the data extracted from a patterned test wafer. Such an effective cross-section area, although it may or may not represent or approximate the true profile of the conductor, may nonetheless accurately estimate the electrical properties such as the actual electrical resistance of the conductor.

Take a deposition process as another illustrative example of simulating the underlying principles of physics, the method or the system may incorporate into the concurrent model of the deposition process the characteristics specific to the deposition process and processing chamber such as the plasma density distribution, introduction and distribution processing gases, introduction and distribution of DC and/or RF power, the electromagnetic characteristics of the deposition process and the processing chamber, and the introduction and distribution of bias on the pedestal and/or the substrate. The method or the system may further incorporate into the concurrent model the interactions between the existing materials on the substrate and some of the aforementioned characteristics.

For example, the method or the system may determine the probability distribution function for re-sputtering or re-deposition of the existing materials on the substrate under the processing conditions as described by the process characteristics. Once the probability distribution function for the re-sputtering or re-deposition is determined, the method or the system may then analyze the effect of re-sputtering or re-deposition to more accurately determine the three-dimensional geometric characteristics of the electronic design features.

In various embodiments of the invention, the method or the system may utilize or combine variation information that describes a geometrical feature of the electronic circuit. For example, to predict thickness it may be necessary to combine a CMP prediction of the top of the conductor and the etch prediction of the bottom of the conductor. There may also be instances where the predictions are a distribution that combines within-die, wafer level, wafer to wafer, or process to process variation into a statistical distribution. As such, the method or system in various embodiments of the invention may produce, for example, a statistical or stochastic representation of a three-dimensional structure that constitutes a three dimensional geometrical feature or descriptor.

Figure 4A:
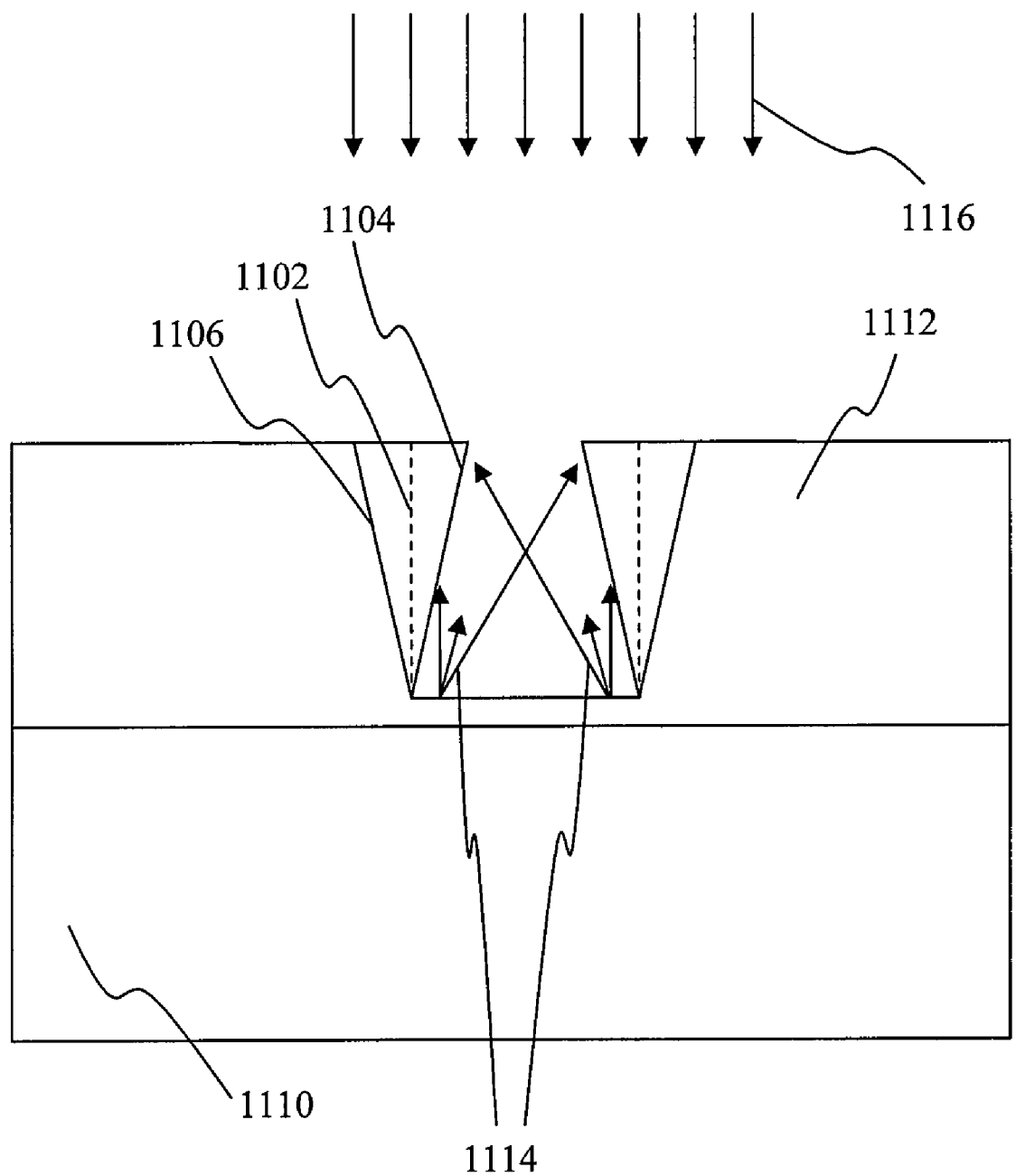
FIG. 4A depicts an example of the process-induced impact on the cross-section of an electronic design feature of an electronic design.
Figure 4B:
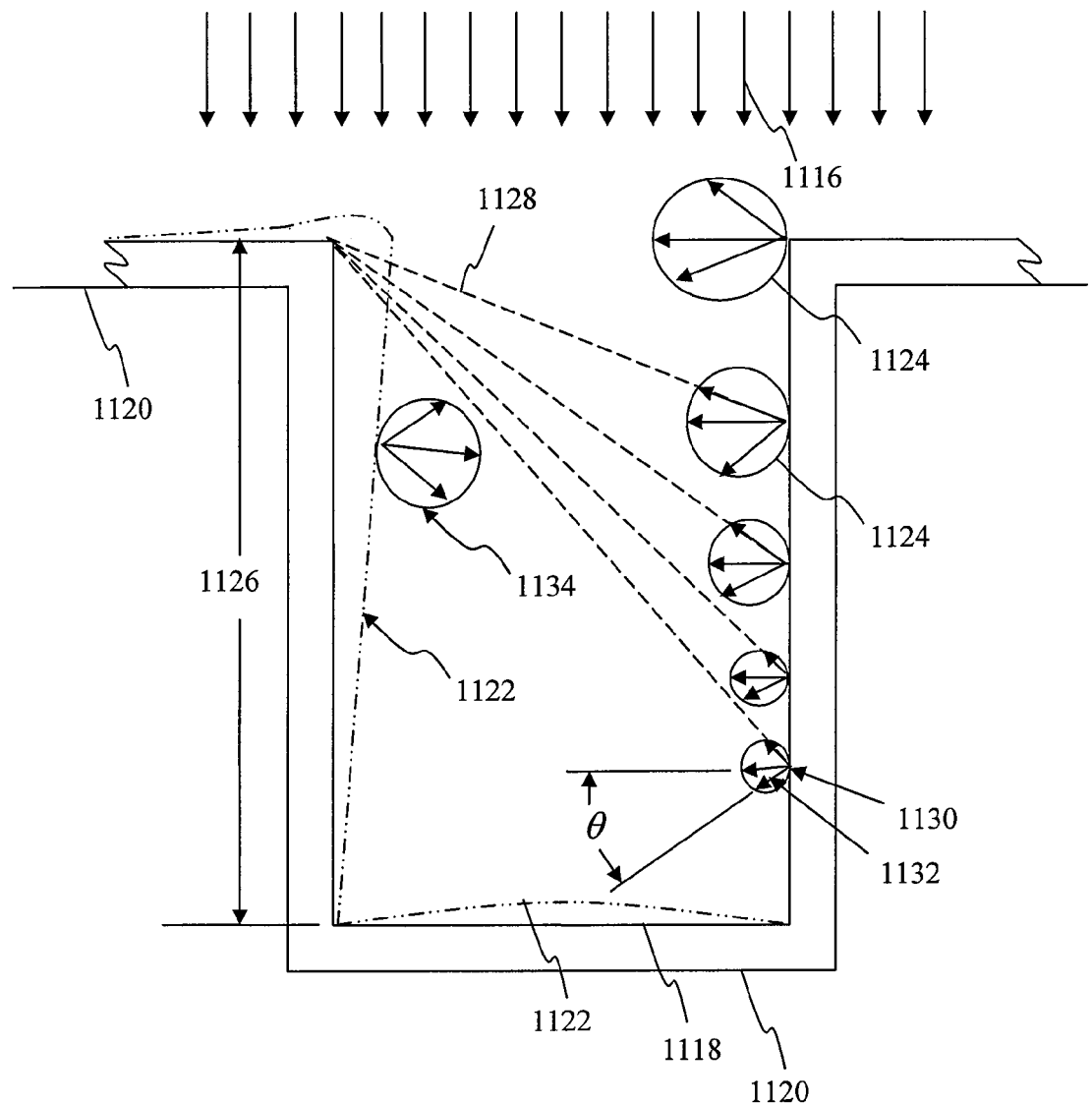
FIG. 4B illustrates a example which depicts more details about the impact of resputtering or redeposition on the three-dimensional profile of a feature of an electronic circuit.

In the alternative, the method or the system may identify or determine spatial distribution function such as a cosine angular distribution along the contour of a feature such as the one as shown in FIG. 4B and then analyze the re-sputtering or re-deposition effects in conjunction with other process specific characteristics such as the plasma distribution in the processing chamber and distribution of bias potential and/or temperature on the substrate pedestal. It should be noted that the spatial distribution function may also carry a temporal dimension; that is, the analysis may be either dynamic in reaching a time dependent solution or static in reaching a steady state solution.

At 310, the method or the system of some embodiments of the present invention determines the design feature characteristics based upon the three-dimensional design feature profiles or geometric characteristics previously determined at 308. At 311, the method or the system of some embodiments of the present invention may optionally determine a characteristic of the electronic circuit based upon the 3-D electronic circuit design feature previously determined at 310. For example, the method or the system of one embodiment of the invention may determine, based upon the three dimensional geometric characteristics of a wire, some electrical characteristics of the wire such as the resistance, capacitance, or inductance at 310 and then determines the timing delay, propagation delay, or gate delay of the electronic circuit at 311 based upon the previously determined electrical characteristics of the wire.

Then the method or the system of some embodiments of the present invention checks to determine whether all of the design objectives or constraints are met and/or whether some of the design objectives or constraints may be relaxed at 312. If all of the design objectives or constraints are met or some of the objectives or constraints, although not satisfied, may be relaxed the method or the system proceeds to 314, and the design is complete. On the other hand, if some of the design objectives or constraints can neither be met nor be relaxed, the method or the system may proceed to 316 to modify the processes or techniques involved in the manufacturing of the electronic circuit. Or, in the alternative, the method or the system may proceed to 318 to modify the electronic circuit designs and then forwards the modified electronic circuit design back to 304 and iteratively repeats actions 308-312. The design objectives or constraints comprise, for example but shall not be limited to, timing requirements, reliability, manufacturability, or performance specifications.

FIG. 4 illustrates an example of the impact of processes or techniques upon which one or more concurrent models are built on the feature profile and/or geometric characteristics such as feature dimensions. In FIG. 4A, the film, 1112, on top of a wafer or an underlying structure, 1110, is subject to a semiconductor fabrication process, 1116, which may comprise but is not limited to a sputtering process or an etching process.

In some embodiments where the semiconductor fabrication process is a deposition process, the designer intends to create a desired profile of a feature, 1102. However, re-deposition or re-sputtering, 1114, may occur from the bottom and side walls of the feature and eventually cause the width of the feature to deform to form a first trapezoidal profile, 1104.

FIG. 4B illustrates more details about the resputtering or redeposition process. In FIG. 4B, a thin film 1112 on top of its underlying structure 1110 is subject to a semiconductor fabrication process 1116 as in FIG. 4A. The deposited film 1118 is thus formed on top of a substrate or an underlying structure 1116. Here, it is assumed that the deposited film 1118 conforms to the profile of the underlying structure, 1116. This assumption is in place for the ease of explanation while the actual profile of the deposited film 1118 may actually assume a profile as shown by 1122. It shall also be noted that profile 1122 is more likely thicker near the top and thus exhibits a slant sidewall rather than a vertical one due to factors such as the line of sight of ion bombardment or aspect ratio of the electronic circuit design feature to be manufactured.

Resputtering occurs when the deposited film 1118 is subject to the ion bombardment of the deposited materials 1116. Here, the emission profile 1124 may be approximated as a cosine function of the emission angle. Due to the particular mechanism of resputtering, the emission profile 1124 is also a function of the vertical distance x, 1126. It shall also be noted that each arrow in the emission profile 1124 represents the probability of emission of the material at the point where the circle contacts the sidewall. For example, arrow 1132 represents the probability the emission at the angle θ of material at the point 1130. Therefore, the emission profile at a point along the sidewall of thin film 1118 may be represented as $f(x,\theta)$ where x denotes the position of the point along the vertical sidewall and θ denotes the emission angle which is measured with respect to the surface normal of the vertical side wall. As indicated above, since the true profile of the thin film may be in the form as represented by 1122, the emission profile may be modified to accommodate this slant sidewall of thin film 1122. In this manner, the method or the system may determine the effect of resputtering or redeposition on the geometric profile of a feature of the electronic circuit by, for example, calculating at each point along the sidewall on the left the respective probability of emission from the sidewall on the right, and vice versa. In one embodiment of the invention, the above calculation may be performed by integration the emission function along the side walls and the bottom of thin film 1118 or 1122.

Some embodiments of the invention obtain the approximate profiles of the design features with the input information of the process conditions such as the bias potential, plasma densities and distribution, vacuum level of the processing chamber, power supply to sustain the plasma, wafer pedestal temperature distribution, other information such as the design layout, and information about the manufacturing-specific variations of fabrication processes. Yet some other embodiments of the present invention capture some or all of the input information by simulating the processes. Yet some other embodiments of the present invention capture some or all of the input information by measuring the results on a test patterned wafer against certain metrics and/or fitting models to the measured results. Yet some other embodiments of the present invention obtain the wire/feature profiles by integrating, for each point along the cross-section of each of the wire/feature profiles, a probability distribution function for the sputtering of materials, e.g., a cosine angular distribution function, for any sputtering point source along the profile, along the entire path of the profile and then analyze or calculate the accumulation of the sputtered materials at other points along the same cross-section of the wire/feature profile. Some other embodiments of the present invention analyze and calculate the approximate wire/feature profiles by simulating the anisotropic etching processes (or other isotropic etching processes) together with the information of the design and the fabrication processes. Some other embodiments of the present invention utilize analytical derivations and Monte Carlo simulations to correlate the emission characteristics of the sputtering point source and the behavior of the impinging particles and with the transport and collision processes in the local area of the profile.

Once the approximate profiles of the features are determined, some embodiments of the present invention further calculate the electrical as well as other properties of the three-dimensional features to further refine the design and ensure whether the design meets the manufacturability, reliability, and/or performance objectives. Such properties comprise, but are not limited to, bulk resistance, capacitance, inductance, IR drop, current densities, or R-C time constants.

In some other embodiments of the present invention where the semiconductor fabrication process, 1116, constitutes an etching process such as an anisotropic etching process, the upper portion of the side walls is subject to different processing characteristics such as different bias potential or a different plasma density and thus may exhibit a faster etch rate to form a second trapezoidal profile, 1106, or other geometrical forms of the profile.

Some other embodiments of the present invention further analyze the impact of these process models on the film, 1112. Some other embodiments of the present invention take these analysis results and forward them onto the next fabrication level such as the next interconnect level. The method or the system of some embodiments of the present invention on the next level incorporates these profiles and variations in feature dimensions to determine the corresponding variations in or distributions of electrical properties. Such electrical properties may comprise but shall not be limited to electrical resistivity, bulk resistivity, electrical resistance, capacitance, power consumption, and IR drop may be further incorporated in the method or the system of some embodiments of the present invention to determine whether some of the nets constitute critical nets and whether the design meets the design objectives such as the timing goals in some other embodiments.

Some embodiments of the present invention translate the information about the process models and/or the design elements into a separate set of requirements without unnecessarily disclosing such process models and/or the design elements to third parties. These methods or systems are particularly useful in protecting the ownership of intellectual property and rights therein. For example, the semiconductor foundries may not wish to disclose such manufacturing specific information to other parties; the processing equipment manufacturers may not wish to disclose the true range of capabilities of their processing equipment to other parties; and IP core owners may wish to grant only the right to use without disclosing further details of such IP cores to the licensees or users.

Some other embodiments of the present invention further obtain the information about the fabricated features of the design and use such information to further calibrate the process models as well as the modifications to the design itself or the fabrication processes so as to improve the accuracy and effectiveness of the above methods.

Some other embodiments further utilize systems utilizing parallel computing architecture to achieve the purpose. Some other embodiments also store the three-dimensional wire/feature profile in a data structure or a database for subsequent retrieval as well as use.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

Various embodiments described herein can be used for any type of design activities, including hardware design, software design, and designs including both hardware and software such as hardware/software co-design activities. For example, some embodiments of the invention can be applied to the design of embedded software and systems.

System Architecture Overview

Figure 5:
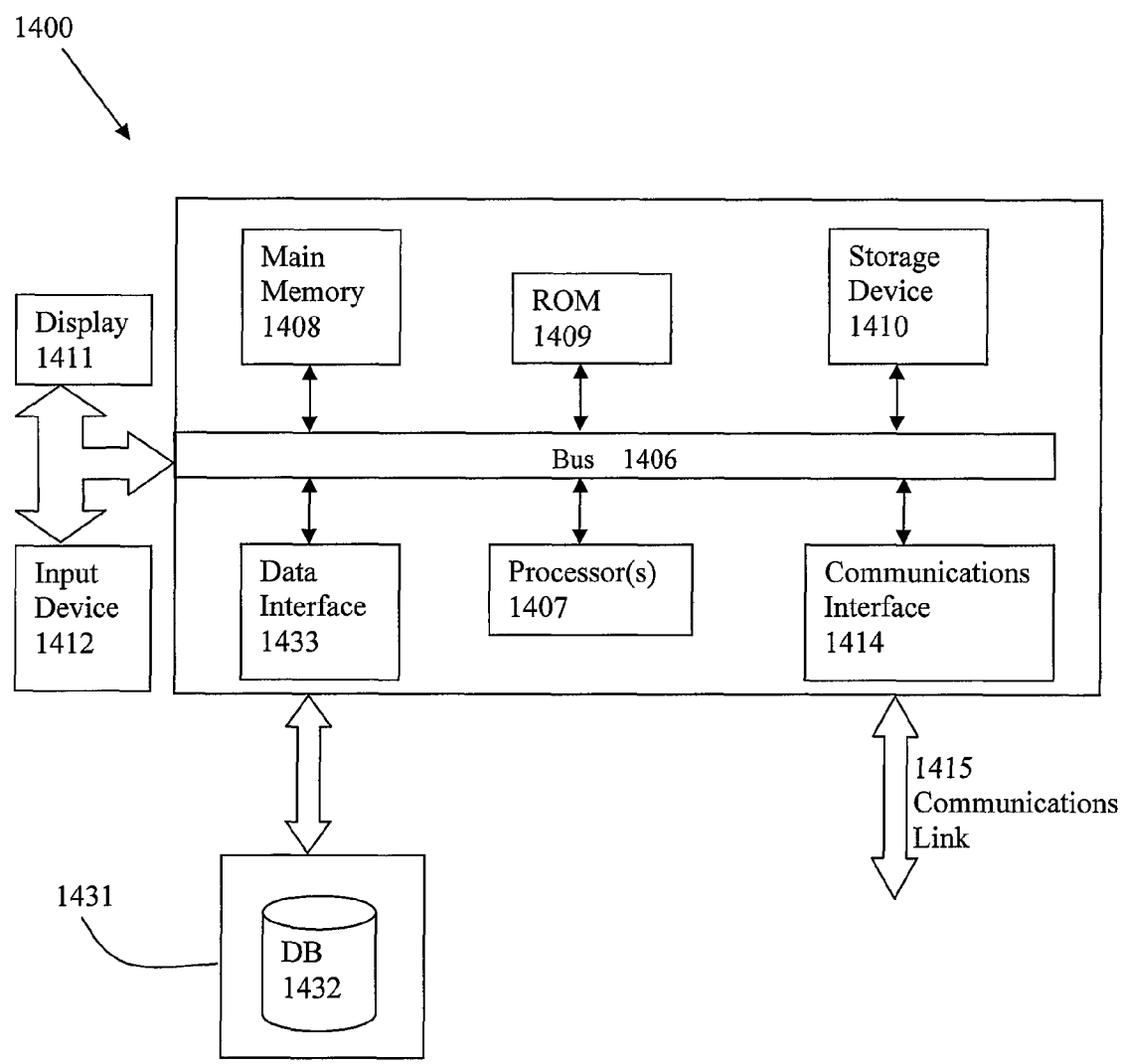
FIG. 5 depicts a computerized system on which a method for accurately determining an electronic design characteristic based upon a geometric characteristic of an electronic design feature.

FIG. 5 is a block diagram of an illustrative computing system 1400 suitable for implementing an embodiment of the present invention. Computer system 1400 includes a bus 1406 or other communication mechanism for communicating information, which interconnects subsystems and devices, such as processor 1407, system memory 1408 (e.g., RAM), static storage device 1409 (e.g., ROM), disk drive 1410 (e.g., magnetic or optical), communication interface 1414 (e.g., modem or Ethernet card), display 1411 (e.g., CRT or LCD), input device 1412 (e.g., keyboard), and cursor control (not shown).

According to one embodiment of the invention, computer system 1400 performs specific operations by processor 1407 executing one or more sequences of one or more instructions contained in system memory 1408. Such instructions may be read into system memory 1408 from another computer readable/usable medium, such as static storage device 1409 or disk drive 1410. In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

The term "computer readable medium" or "computer usable medium" as used herein refers to any medium that participates in providing instructions to processor 1407 for execution. Such a medium may take many forms, including but not limited to, non-volatile media and volatile media. Non-volatile media includes, for example, optical or magnetic disks, such as disk drive 1410. Volatile media includes dynamic memory, such as system memory 1408.

Common forms of computer readable media includes, for example, floppy disk, flexible disk, hard disk, magnetic tape, any other magnetic medium, CD-ROM, any other optical medium, punch cards, paper tape, any other physical medium with patterns of holes, RAM, PROM, EPROM, FLASH-EPROM, any other memory chip or cartridge, or any other medium from which a computer can read.

In an embodiment of the invention, execution of the sequences of instructions to practice the invention is performed by a single computer system 1400. According to other embodiments of the invention, two or more computer systems 1400 coupled by communication link 1415 (e.g., LAN, PTSN, or wireless network) may perform the sequence of instructions required to practice the invention in coordination with one another.

Computer system 1400 may transmit and receive messages, data, and instructions, including program, i.e., application code, through communication link 1415 and communication interface 1414. Received program code may be executed by processor 1407 as it is received, and/or stored in disk drive 1410, or other non-volatile storage for later execution. Computer system 1400 may also interact with a database system 1432 via a data interface 1433 where the computer system 1400 may store and retrieve information or data of the electronic design into and from the database system.

In the foregoing specification, the invention has been described with reference to specific embodiments thereof. It will, however, be evident that various modifications and changes may be made thereto without departing from the broader spirit and scope of the invention. For example, the above-described process flows are described with reference to a particular ordering of process actions. However, the ordering of many of the described process actions may be changed without affecting the scope or operation of the invention. The specification and drawings are, accordingly, to be regarded in an illustrative rather than restrictive sense.

What is claimed is:

1. A machine implemented method for determining an electronic design characteristic based upon a geometric characteristic of an electronic design feature, comprising:
using a computer system which comprises at least one processor and is programmed for performing:
identifying a first concurrent model for a first level of an electronic circuit design of an electronic circuit to be manufactured by a first manufacturing process or technique;
determining a first three-dimensional geometric characteristic for a first feature on the first level by using at least the first concurrent model;
determining whether a first design requirement for the first level is satisfied based upon the first three-dimensional geometric characteristic; and
displaying a result of determining a first three-dimensional geometric characteristic or storing the result in a non-transitory, tangible machine accessible medium.

2. The machine implemented method of claim 1, further comprises:
identifying a second concurrent model for a second level of the electronic circuit design of the electronic circuit to be manufactured by a second manufacturing process or technique.

3. The machine implemented method of claim 2 further comprising:
determining a second three-dimensional geometric characteristic for a second feature on the second level; and
determining whether a second design requirement for the second level is satisfied based upon the second three-dimensional geometric characteristic.

4. The machine implemented method of claim 2, further comprising:
forwarding a result of determining a three-dimensional geometric characteristic for a feature on the first level to the second level of the electronic circuit design; and
determining whether a second design requirement for the second level is satisfied based upon the first three-dimensional geometric characteristic.

5. The machine implemented method of claim 4 further comprising:
determining whether a third design requirement for the first level and the second level combined is satisfied.

6. The machine implemented method of claim 2, in which the first manufacturing process or technique or the second manufacturing process or technique comprises a fabrication process or an image processing process or technique, wherein
the fabrication process comprises a deposition, removal, patterning, or property modification process; and
the image processing processor or technique comprises OAI, SRAF, or PSM.

7. The machine implemented method of claim 1, further comprising:
identifying a first characteristic for the first manufacturing process or technique.

8. The machine implemented method of claim 7, in which the first characteristic comprises plasma distribution, temperature distribution, process chemistry distribution, electromagnetic field distribution, or power distribution.

9. The machine implemented method of claim 7, the first characteristic comprising one or more attributes of a processing chamber within which the electronic circuit is to be manufactured.

10. The machine implemented method of claim 7, in which the determining a first three-dimensional geometric characteristic for a first feature on the first level is based upon the first characteristic for the first manufacturing process or technique.

11. The machine implemented method of claim 1, in which the determining a first three-dimensional geometric characteristic comprises:
directly simulating an underlying physics principle of the first process or technique.

12. The machine implemented method of claim 1, in which the determining a first three-dimensional geometric characteristic comprises:
directly simulating the first manufacturing process or technique; and
tuning a result of the directly simulating with information obtained from a patterned test wafer or from a source of limited fidelity.

13. The machine implemented method of claim 1, in which the determining a first three-dimensional geometric characteristic comprises:

determining a first effective three-dimensional geometric characteristic based upon one or more rules determined with information obtained from a patterned test wafer or from a source of limited fidelity.

14. The machine implemented method of claim 1, further comprising:
    determining a property of the electronic design feature based upon the three-dimensional geometric characteristic of the first feature.

15. The machine implemented method of claim 14, in which the property of the feature comprises a physical property, an electrical property, a thermal property, or a chemical property of the feature.

16. The machine implemented method of claim 1, in which the first design requirement comprises a performance objective or constraint, a manufacturability objective or constraint, or a reliability objective or constraint.

17. The machine-implemented method of claim 1, further comprising:
    combining the first concurrent model with statistical variability measured from or produced by an additional model for the first level to produce a distribution of values related to the first geometric characteristic.

18. The machine-implemented method of claim 1, in which a portion of the electronic circuit design is generated by a context simulation method.

19. A computer program product comprising a non-transitory computer-usable storage medium having executable code which, when executed by a processor of a computer system, causes the computer system to execute a process for accurately determining an electronic design characteristic based upon a geometric characteristic of an electronic design feature, the process comprising:
    identifying a first concurrent model for a first level of an electronic circuit design of an electronic circuit to be manufactured by a first manufacturing process or technique;
    determining a first three-dimensional geometric characteristic for a first feature on the first level by using at least the first concurrent model;
    determining whether a first design requirement for the first level (objective or constraint) is satisfied based upon the first three-dimensional geometric characteristic; and
    displaying a result of determining a first three-dimensional geometric characteristic or storing the result in a non-transitory tangible machine accessible medium or a computer storage device.

20. The computer program product of claim 19, the process further comprising:
    identifying a second concurrent model for a second level of the electronic circuit design of the electronic circuit to be manufactured by a second manufacturing process or technique;
    determining a second three-dimensional geometric characteristic for a second feature on the second level; and
    determining whether a second design requirement for the second level is satisfied based upon the second three-dimensional geometric characteristic.

21. The computer program product of claim 19, the process further comprising:
    identifying a second concurrent model for a second level of the electronic circuit design of the electronic circuit to be manufactured by a second manufacturing process or technique;
    forwarding a result of determining a three-dimensional geometric characteristic for a feature on the first level to the second level of the electronic circuit design;
    determining whether a second design requirement for the second level is satisfied based upon the first three-dimensional geometric characteristic; and
    determining whether a third design requirement for the first level and the second level combined is satisfied.

22. The computer program product of claim 19, the process further comprising:
    identifying a first characteristic for the first manufacturing process or technique;
    determining a first effective three-dimensional geometric characteristic based upon one or more rules determined with information obtained from a patterned test wafer or from a source of limited fidelity.

23. The computer program product of claim 19, wherein the act of determining the first three-dimensional geometric characteristic comprises:
    directly simulating the first manufacturing process or technique; and
    tuning a result of the directly simulating with information obtained from a patterned test wafer or from a source of limited fidelity.

24. The computer program product of claim 19, further comprising:
    combining the first concurrent model with statistical variability measured from or produced by an additional model for the first level to produce a distribution of values related to the first geometric characteristic.

25. A system for accurately determining an electronic design characteristic based upon a geometric characteristic of an electronic design feature, comprising:
    a computer system which comprises at least one processor and is programmed for performing:
    identifying a first concurrent model for a first level of an electronic circuit design of an electronic circuit to be manufactured by a first manufacturing process or technique;
    determining a first three-dimensional geometric characteristic for a first feature on the first level by using at least the first concurrent model;
    determining whether a first design requirement for the first level is satisfied based upon the first three-dimensional geometric characteristic; and
    displaying a result of determining a first three-dimensional geometric characteristic or storing the result in a tangible machine accessible medium.

26. The system of claim 25, wherein the computer system is further programmed for performing:
    identifying a second concurrent model for a second level of the electronic circuit design of the electronic circuit to be manufactured by a second manufacturing process or technique;
    determining a second three-dimensional geometric characteristic for a second feature on the second level; and
    determining whether a second design requirement for the second level is satisfied based upon the second three-dimensional geometric characteristic.

27. The system of claim 25, wherein the computer system is further programmed for performing:
    identifying a second concurrent model for a second level of the electronic circuit design of the electronic circuit to be manufactured by a second manufacturing process or technique;
    forwarding a result of determining a three-dimensional geometric characteristic for a feature on the first level to the second level of the electronic circuit design;

determining whether a second design requirement for the second level is satisfied based upon the first three-dimensional geometric characteristic; and determining whether a third design requirement for the first level and the second level combined is satisfied.

28. The system of claim 25, wherein the computer system is further programmed for performing:

identifying a first characteristic for the first manufacturing process or technique;

determining a first effective three-dimensional geometric characteristic based upon one or more rules determined with information obtained from a patterned test wafer or from a source of limited fidelity.

29. The system of claim 25, wherein the computer system is further programmed for performing:

directly simulating the first manufacturing process or technique; and tuning a result of the directly simulating with information obtained from a patterned test wafer or from a source of limited fidelity.

30. The system of claim 25, wherein the computer system is further programmed for performing:

combining the first concurrent model with statistical variability measured from or produced by an additional model for the first level to produce a distribution of values related to the first geometric characteristic.

* * * * *